United States Patent
Kim et al.

(10) Patent No.: US 7,989,861 B2
(45) Date of Patent: Aug. 2, 2011

(54) IMAGE SENSOR AND METHOD OF STABILIZING A BLACK LEVEL IN AN IMAGE SENSOR

(75) Inventors: Yi-Tae Kim, Hwaseong-si (KR); Sang-Il Jung, Seoul (KR); Yun-Ho Jang, Seoul (KR); Kyung-Ho Lee, Suwon-si (KR); Sae-Young Kim, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 327 days.

(21) Appl. No.: 12/196,491

(22) Filed: Aug. 22, 2008

(65) Prior Publication Data

US 2009/0108312 A1 Apr. 30, 2009

(30) Foreign Application Priority Data

Aug. 24, 2007 (KR) ........................ 10-2007-0085638

(51) Int. Cl.
*H01L 31/062* (2006.01)
*H01L 31/112* (2006.01)
*H01L 21/00* (2006.01)

(52) U.S. Cl. ......... 257/294; 257/E31.079; 257/E21.211; 438/73

(58) Field of Classification Search ................... 257/294, 257/E31.079, E21.211; 438/73
See application file for complete search history.

(56) References Cited

U.S. PATENT DOCUMENTS

| 6,235,549 | B1 * | 5/2001 | Bawolek et al. | 438/48 |
| 6,465,859 | B1 * | 10/2002 | Fujiwara et al. | 257/435 |
| 7,683,451 | B2 * | 3/2010 | Shin | 257/435 |
| 2004/0131948 | A1 * | 7/2004 | Yan | 430/5 |
| 2005/0161584 | A1 * | 7/2005 | Tanaka et al. | 250/208.1 |
| 2006/0102940 | A1 * | 5/2006 | Cha et al. | 257/294 |
| 2006/0175535 | A1 * | 8/2006 | Park et al. | 250/208.1 |
| 2006/0237629 | A1 * | 10/2006 | Oda | 250/208.1 |
| 2009/0026370 | A1 * | 1/2009 | Wagner et al. | 250/316.1 |

FOREIGN PATENT DOCUMENTS

| JP | 2002-064196 | 2/2002 |
| JP | 2002-329854 | 11/2002 |
| KR | 2006-90515 | 8/2006 |

* cited by examiner

*Primary Examiner* — Lex Malsawma
(74) *Attorney, Agent, or Firm* — Stanzione & Kim, LLP

(57) ABSTRACT

An image sensor includes a substrate, an anti-reflection board and a light shielding film. The substrate includes first pixels to receive a light, and second pixels to provide a black level compensation. The first pixels are formed in an active region and the second pixels are formed in a first region spaced apart from the active region in a row direction. The anti-reflection board is formed in a second region above the substrate, and the second region is between the active region and the first region. The light shielding film is formed above the anti-reflection board, and the light shielding film covers an optical black region including the first and second regions. Therefore, the image sensor may be used in a CCD type image sensor and a CMOS type image sensor to provide a stabilized black level, thereby improving a quality of a displayed image.

22 Claims, 8 Drawing Sheets

IMAGE SENSOR AND METHOD OF STABILIZING A BLACK LEVEL IN AN IMAGE SENSOR

CROSS-REFERENCE TO RELATED APPLICATIONS

This application claims priority under 35 USC §119 to Korean Patent Application No. 2007-85638, filed on Aug. 24, 2007 in the Korean Intellectual Property Office (KIPO), the contents of which are herein incorporated by reference in their entirety.

BACKGROUND OF THE INVENTION

1. Field of the Invention

The present general inventive concept relates to an image sensor, and more particularly, to an image sensor to stabilize a black level.

2. Description of the Related Art

An image sensor converts photo images into electric signals, and the image sensor is widely used in digital cameras, game devices, vision systems, and the like.

The image sensor may be classified as a charge coupled device (CCD) type and a complementary metal-oxide semiconductor (CMOS) type. The CCD type image sensor generally has lower noise levels and better image quality than the CMOS type image sensor, but the CCD type image sensor has disadvantages in power consumption. The CMOS type image sensor may be manufactured by common semiconductor manufacturing technologies, and the CMOS type image sensor may be easily integrated into other systems such as amplifiers or signal processing units. The CMOS type image sensor also has high processing speeds and lower power consumption than the CCD type image sensor.

The CMOS image sensor may have a three-transistor pixel structure or a four-transistor pixel structure. The CMOS image sensor may have a pixel structure where pixels share one or more transistors.

FIG. 1 is a cross-sectional view of an image sensor 100 for describing a light leakage phenomenon of an optical black region.

Referring to FIG. 1, the image sensor 100 includes a substrate 110 having pixels 111, 113 and 115. In an active region, first pixels 111 are arranged in a matrix type for providing image signals by converting incident lights into electric signals. In an optical black region where the incident light is shielded by a light shielding film 140, second pixels 115 are arranged for providing a black level or a dark level corresponding to a reference level irrelevant to the incident lights. In the optical black region adjacent to the active region, additional pixels 113, i.e., dummy pixels, may be arranged.

The black level is provided by the second pixels 115 in the optical black region to be used as a reference level reflecting environmental factors such as temperature. A difference between the image signals provided by the first pixels 111 and the black level is regarded as real image signals.

As illustrated in FIG. 1, a light 151 passes through a boundary between the active region and the optical black region to reach the second pixels 115 by reflections due to wire layers 120 and 130. Also, a light 152 may reach the second pixels 115 by total reflection at a lower surface of the substrate 110. The lights 151 and 152 may distort the black level by causing a photoelectric effect to the second pixels 115. The distortion of the black level due to the lights 151 and 152 is referred to as a light leakage phenomenon. The calculated image signals based on the dark level of the second pixels 115 affected by the light leakage phenomenon are darker than the real image signals. Also one or more black crosswise lines may be caused in a displayed image and thus a quality of the displayed image may be degraded.

SUMMARY OF THE INVENTION

The present general inventive concept provides an image sensor capable of stabilizing a black level.

The present general inventive concept provides a method of stabilizing a black level in an image sensor.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an image sensor including a substrate, an anti-reflection board and a light shielding film.

The substrate may include first pixels to receive a light, and second pixels for a black level compensation. The first pixels may be formed in an active region and the second pixels may be formed in a first region spaced apart from the active region in a row direction. The anti-reflection board may be formed in a second region above the substrate, and the second region may be between the active region and the first region. The light shielding film may be formed above the anti-reflection board, and the light shielding film may cover an optical black region including the first and second regions.

The anti-reflection board may include a metal board and an anti-reflection coating film. The metal board may be extended in the second region above the substrate in row direction and the anti-reflection coating film may be formed on an upper surface of the metal board.

The anti-reflection coating film may include a tantalum or a nitrogen-containing tantalum.

The metal board may be formed on a first layer including wires extended in column direction.

A row-directional length of the anti-reflection board may be longer than a vertical interval between the substrate and the light shielding film.

The substrate may include a drain formed in the substrate beneath the anti-reflection board in the second region.

A depth of the drain may be greater than depths of the first and second pixels.

The image sensor may further include a poly-silicon layer formed on an upper surface of the drain and a drain electrode including a silicide film formed on the poly-silicon.

The substrate may correspond to a p-type substrate and the drain may be formed by a doping with an n-type impurities.

The drain may be electrically connected to the metal board of the anti-reflection board, and a positive voltage may be applied to the metal board.

The drain may be electrically connected to the metal board through a via-contact.

The image sensor may further include an anti-reflection coating film formed on a lower surface of the substrate.

The anti-reflection coating film formed on the lower surface of the substrate may include a tantalum or a nitrogen-containing tantalum.

A roughness of the lower surface of the substrate may be increased before forming the anti-reflection coating film.

The foregoing and/or other aspects and utilities of the present general inventive concept may also be achieved by providing a method of stabilizing a black level in an image sensor according to some example embodiments, first pixels are formed in an active region of a substrate and second pixels are formed in a first region spaced apart from the active region in row direction. The first pixels are for receiving a light and the second pixels are for a black level compensation. An anti-reflection board is formed in a second region above the substrate. The second region is between the active region and the first region. A light shielding film is formed above the anti-reflection board and the light shielding film covers optical black region including the first and second regions The anti-reflection board in the second region above the substrate may be formed by forming a metal board extended in column direction in the second region above the substrate and forming an anti-reflection coating film on an upper surface of the metal board.

The anti-reflection coating film on the upper surface of the metal board may be formed by coating a tantalum or a nitrogen-containing tantalum on the upper surface of the metal board.

The metal board structured in the second region above the substrate may be formed by forming the metal board on a first layer including wires extended in column direction.

A drain may be formed in the substrate beneath the anti-reflection board in the second region, a poly-silicon layer may be formed on an upper surface of the drain, and a drain electrode including a silicide film may be formed on an upper surface of the poly-silicon layer.

The substrate may correspond to a p-type substrate, the drain may be formed by doping n-type impurities, and a depth of the drain may be greater than depths of the first and second pixels.

The drain electrode may be electrically connected to the anti-reflection board and a positive voltage may be applied to the metal board.

An anti-reflection coating film may be formed on a lower surface of the substrate.

The anti-reflection coating film may be formed on the lower surface of the substrate by coating a tantalum or a nitrogen-containing tantalum beneath the lower surface of the substrate.

A roughness of the lower surface of the substrate may be increased before forming the anti-reflection coating film on the lower surface of the substrate.

The foregoing and/or other aspects and utilities of the present general inventive concept may also be achieved by providing an image sensor including a substrate including first pixels to receive a light and second pixels to provide a reference level for black level compensation, a light shield film formed above the substrate, and an anti-reflection board formed between the substrate and the light shield film and between the first pixels and the second pixels to prevent the light from being reflected toward the second pixels.

The image sensor may further include a wire layer disposed between the substrate and the light shield film to connect corresponding ones of the first pixels and the second pixels, and the anti-reflection board may be formed on the wire layer.

The image sensor may further include another anti-reflection board formed on the substrate.

The image sensor may further include third pixels disposed opposite to the first pixels with respect to the first pixels to provide another reference level for black level compensation, and another anti-reflection board formed between the first pixels and the second pixels to prevent the light from being reflected toward the third pixels.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
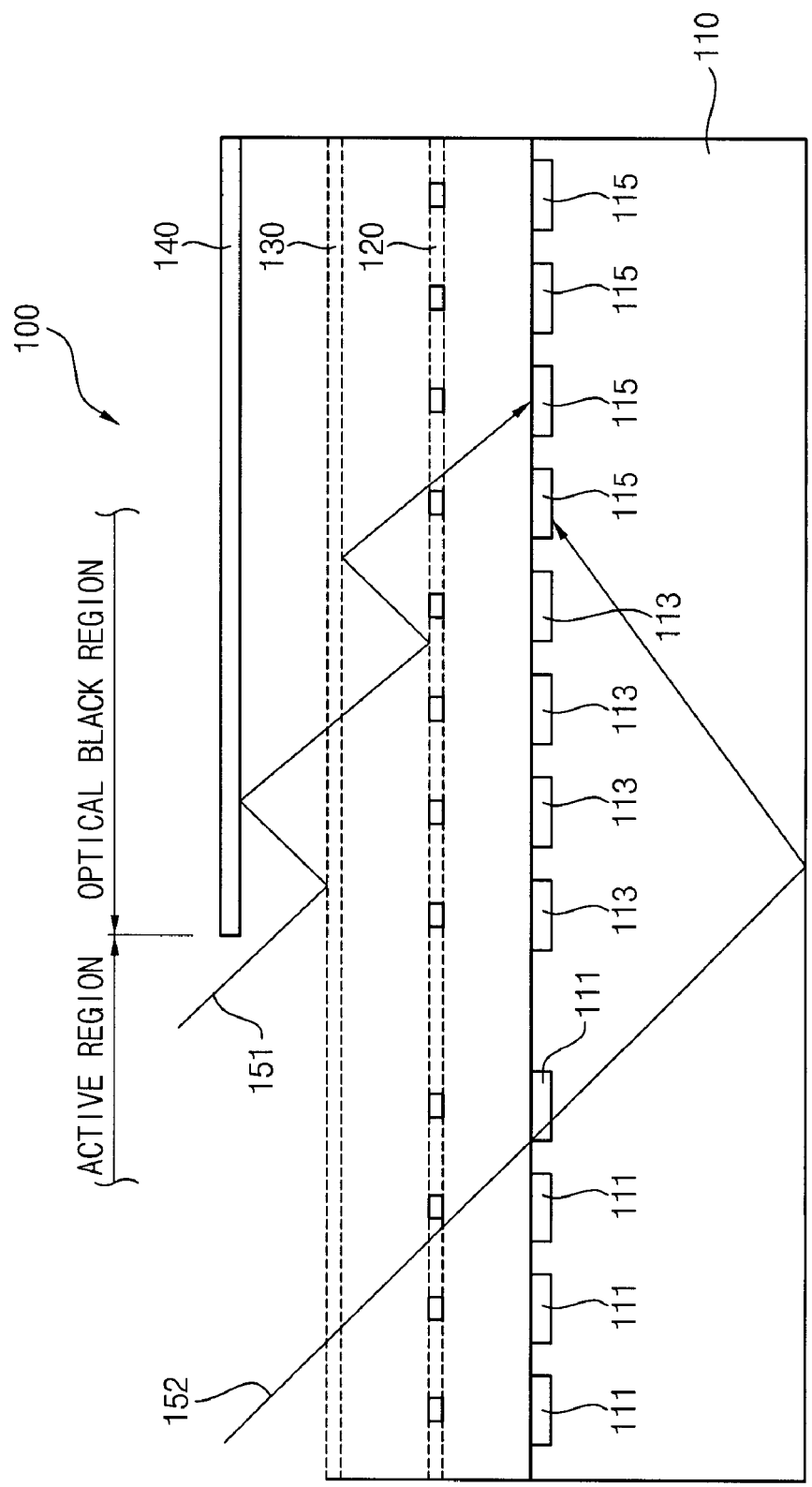
FIG. 1 is a cross-sectional view of an image sensor for illustrating a light leakage phenomenon of an optical black region.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
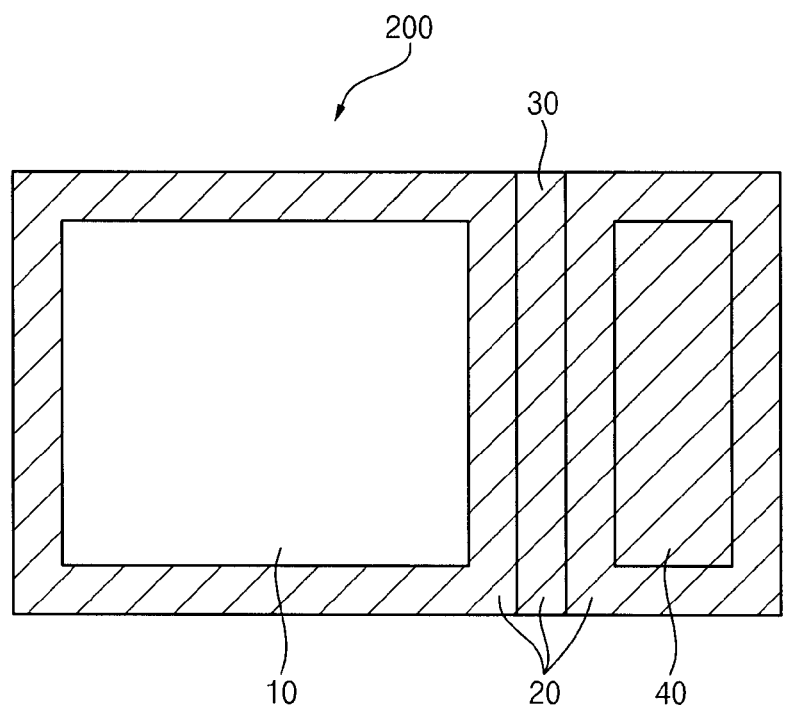
FIG. 2 is a diagram illustrating an image sensor according to an embodiment of the present genera inventive concept.

FIG. 2 is a diagram illustrating an image sensor 200 according to an embodiment of the present genera inventive concept.

Referring to FIG. 2, the image sensor 200 includes an active region 10 and an optical black region 20. The optical black region 20 includes a first region 40 and a second region 30.

First pixels, that is, active pixels are formed in the active region 10 of a substrate in row and/or column directions to receive a light, and second pixels, that is, auto dark level compensation (ADLC) pixels, are formed in the first region 40 spaced apart from the active region 10 in a row direction to compensate a black level (i.e., dark level). A light leakage prevention structure including an anti-reflection board is formed in the second region 30. The second region 30 may be between the active region 10 and the first region 40. A light shielding film may be formed above the anti-reflection board, so that the optical black region 20 including the first region 40 and the second region 30 may be shielded by the light shielding film.

By forming the light leakage prevention structure including the anti-reflection board in the second region 30, which is adjacent to the active region 10, between the substrate and the light shielding film, a light, for example, the light 151 as illustrated in FIG. 1, may be prevented from reaching the second pixels 115.

Figure 3:
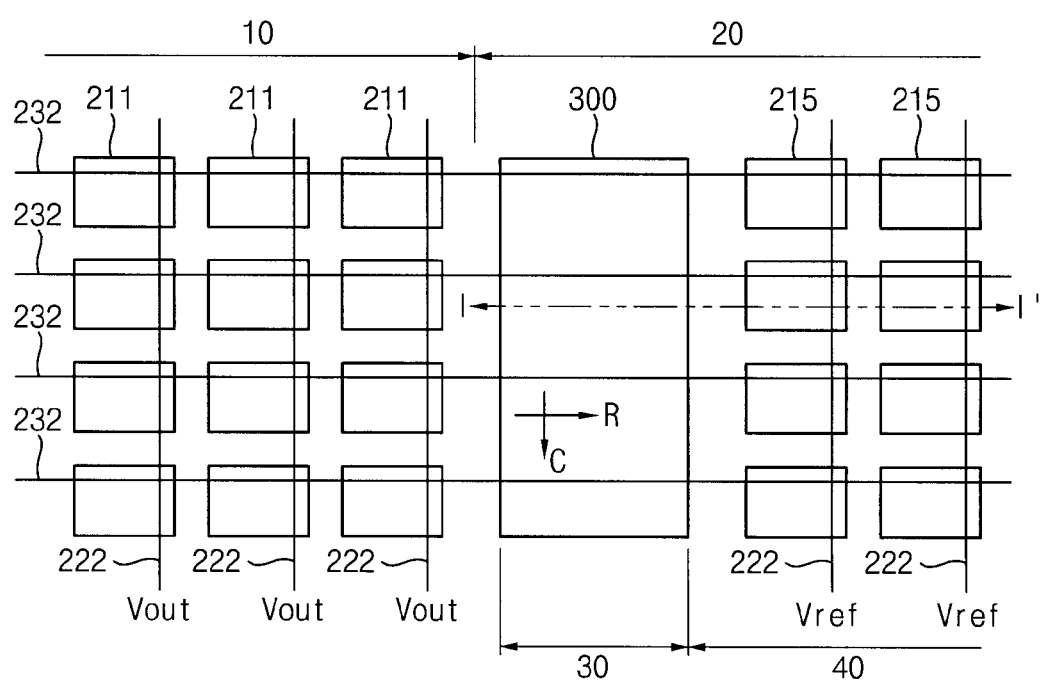
FIG. 3 is a diagram illustrating pixels and an anti-reflection board in the image sensor of FIG. 2.

FIG. 3 is a diagram illustrating pixels and anti-reflection board in the image sensor of FIG. 2 according to some example embodiments.

Referring to FIG. 3, first pixels 211 are formed in the active region 10 to receive a light, second pixels 215 are formed in the first region 40 spaced apart from the active region 10, and the anti-reflection board 300 is formed above the substrate in the second region 30 between the active region 10 and the first region 40.

First wires 232 may be arranged above the substrate in row direction and second wires 222 may be arranged above the substrate in column direction. The first wires 232 may be commonly connected to the first pixels 211 in the active region 10 and the second pixels 215 in the first region 40, and thus the first wires 232 may be extended in row direction through the second region 30.

Electrical image signals Vout provided by the first pixels 211 and reference signals Vref provided by the second pixels 215 may be transferred to an internal logic circuit (not shown) through the second wires 222. A plurality of the second pixels 215 may correspond to a row, and an average level of the reference signals Vref may be provided as a black level that is subtracted from the image signals Vout.

Figure 4:
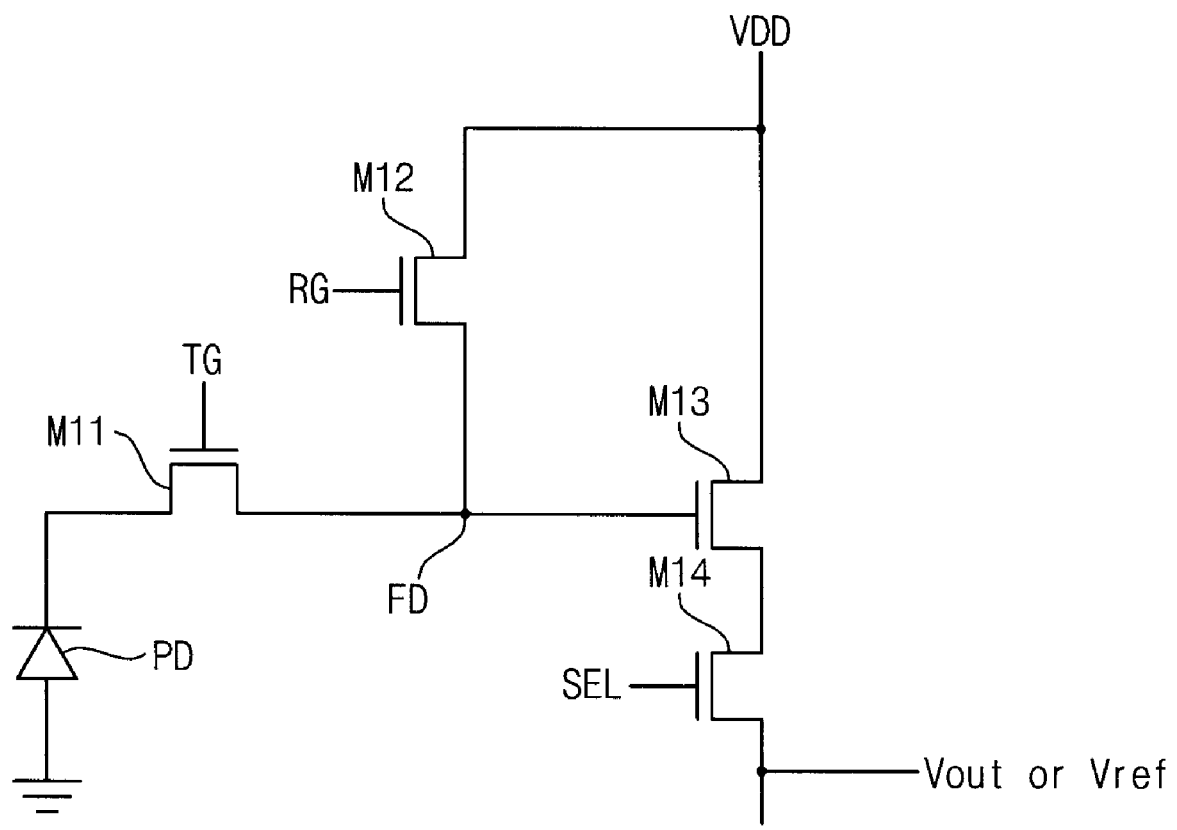
FIG. 4 is a circuit diagram illustrating an example of a pixel structure in the image sensor of FIG. 3.

FIG. 4 is a circuit diagram illustrating an example of a pixel structure in the image sensor of FIG. 3.

Referring to FIG. 4, the pixel of the image sensor 200 includes a photoelectric conversion unit, such as a photodiode PD, a transfer transistor M11, a reset transistor M12, a source follower transistor M13 and a selection transistor M14. Although FIG. 4 illustrates four-transistor structure, the present general inventive concept is not limited thereto. The image sensor may have a three-transistor structure, a five-transistor structure or a structure where pixels share one or more transistors.

Hereinafter, an operation of the image sensor 200 is described with reference to FIGS. 3 and 4.

When the reset transistor M12 is turned on by raising a voltage level of a gate RG of the reset transistor M12, a voltage level of a floating diffusion node FD, which is a sensing node, increases up to a power supply voltage VDD.

When an external light is incident onto the photodiode PD during a photo integration period, electron-hole pairs are generated in proportion to the amount of the incident light.

After the photo integration period, when a voltage level of a gate TG of the transfer transistor M11 increases, electrons integrated within the photodiode PD are transferred to the floating diffusion node FD through the transfer transistor M11. The electric potential of the floating diffusion node FD drops in proportion to the amount of the transferred electrons, and then the electric potential of the source in the source follower transistor M13 is varied depending on the amount of the transferred electrons of the floating diffusion node FD.

When the selection transistor M14 is turned on by raising a voltage level of a gate SEL of the selection transistor M14, the electric potential of the floating diffusion node FD is transferred, as an output signal, through the source follower transistor M13. As such, the first pixels 211 convert the incident light to electric signals by performing the photoelectric conversion and outputs the image signals Vout. The second pixels 215 shielded from the incident light outputs the reference signals Vref for the black level compensation. Structures of the first pixels 211 may be equal to structures of the second pixels 215.

In a layout of the image sensor 200 as illustrated in FIG. 3, the outputs Vout and Vref of the pixels 211 and 215 may be transferred through the second wires 222, and the voltages of the gates TG, RG and SEL in the transistors M11, M12 and M14 may be transferred through the first wires 232.

The second region 30 may exclude the second wires 222, and the anti-reflection board 300 may be formed in the same layer as the second wires 222 without additional process.

FIGS. 5 through 8 are cross-sectional views illustrating an image sensor according to an embodiment of the present general inventive concept, which are taken substantially along the line I-I' of FIG. 3. In FIGS. 5 through 8, the active region 10 illustrated in FIGS. 2 through 3 is omitted for convenience of description.

Figure 5:
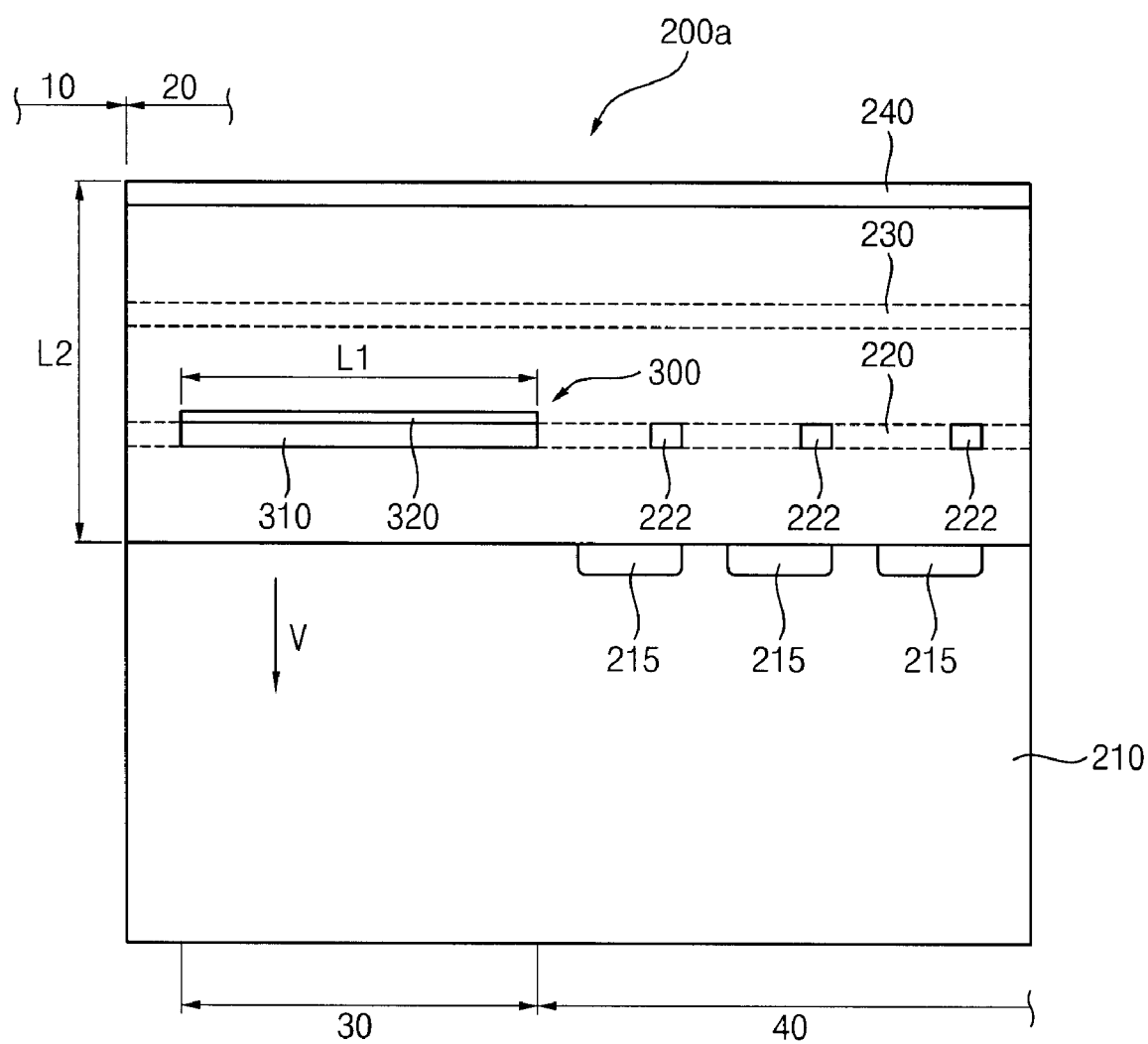
FIGS. 5 through 8 are cross-sectional views illustrating an image sensor according to an embodiment of the present genera inventive concept.

Referring to FIG. 3 and FIG. 5, the first pixels 211, that is, the active pixels for receiving the light are formed in the active region 10 of the substrate 210 in an image sensor 200a. The second pixels 215, that is, the ADLC pixels are formed in the first region 40 spaced apart from the active region 10 in a row direction R and/or a column direction C. The anti-reflection board 300 is formed above the substrate 210 in the second region 30 between the active region 10 and the first region 40. The light shielding film 240 is formed above the anti-reflection board 300, such that the light shielding film 240 may cover the entire optical black region 20 including the first region 40 and the second region 30.

The anti-reflection board 300 may include a metal board 310 and an anti-reflection coating film 320. The metal board is extended in the column direction C in the second region above the substrate 210, and the anti-reflection coating film is formed on an upper surface of the metal board 310.

The image sensor 200a may include a plurality of wire layers such as a first wire layer 230 and a second wire layer 220. In the first wire layer 230, the first wires 232 may be arranged in row direction. In the second wire layer 220, the second wires 222 may be arranged in column direction. With reference to FIG. 3 and FIG. 4, the first wires 232 for transferring the voltages of the gates TG, RG and SEL in the transistors M11, M12 and M14 may be formed in the first wire layer 230, and the second wires 222 for transferring the outputs Vout and Vref in the pixels 211 and 215 may be formed in the second wire layer 220.

The metal board 310 may be formed in the second wire layer 220 in which the second wires 222 are formed. In this case, the metal board 310 may be formed by using the same process as forming the second wires 222 without additional process.

When a row-directional length L1 of the metal board 310 is relatively long, the image sensor 200*a* effectively prevents the light leakage. However, the row-directional length L1 of the metal board 310 may be limited due to a layout margin according to miniaturization of the image sensor 200*a*. For example, the row-directional length L1 of the metal board 310 may be longer than a length L2 of a vertical interval between the substrate 210 and the light shielding film 240 in a vertical direction V. The vertical direction V may be perpendicular to the row direction R and/or the column direction C.

The anti-reflection coating film 320 on the metal board 310 may include a tantalum (Ta) or a nitrogen-containing tantalum (TaxNy). Therefore, the leakage light 151 through the boundary between the active region 10 and the optical black region 20 is absorbed into the anti-reflection coating film 320, and the image sensor 200*a* may stabilize the black level by decreasing a distortion of the black level provided by the second pixels 215.

The anti-reflection coating film 320 may have a reflectivity lower than the first wire layer 230 and second wire layer 220, or lower than the first pixels 211 and the second pixels 215.

The metal board 310 may have a thickness substantially same as a thickness of the second wire layer 220 in the vertical direction V. It is possible that a thickness of the metal board 310 and the anti-reflection coating film 320 may be the substantially same as the thickness of the second wire layer 220. The metal board 310 may have a column-directional length L3 in the column direction C, and the column-directional length L3 may be equal to or longer than the row-directional length L1.

The metal board 310 may be disposed at an area between the light shielding layer 240 and the substrate 210. The metal board 310 may be disposed closer to the substrate 210 than the light shielding film 240 and the first wire layer 230 in the vertical direction V.

Figure 6:
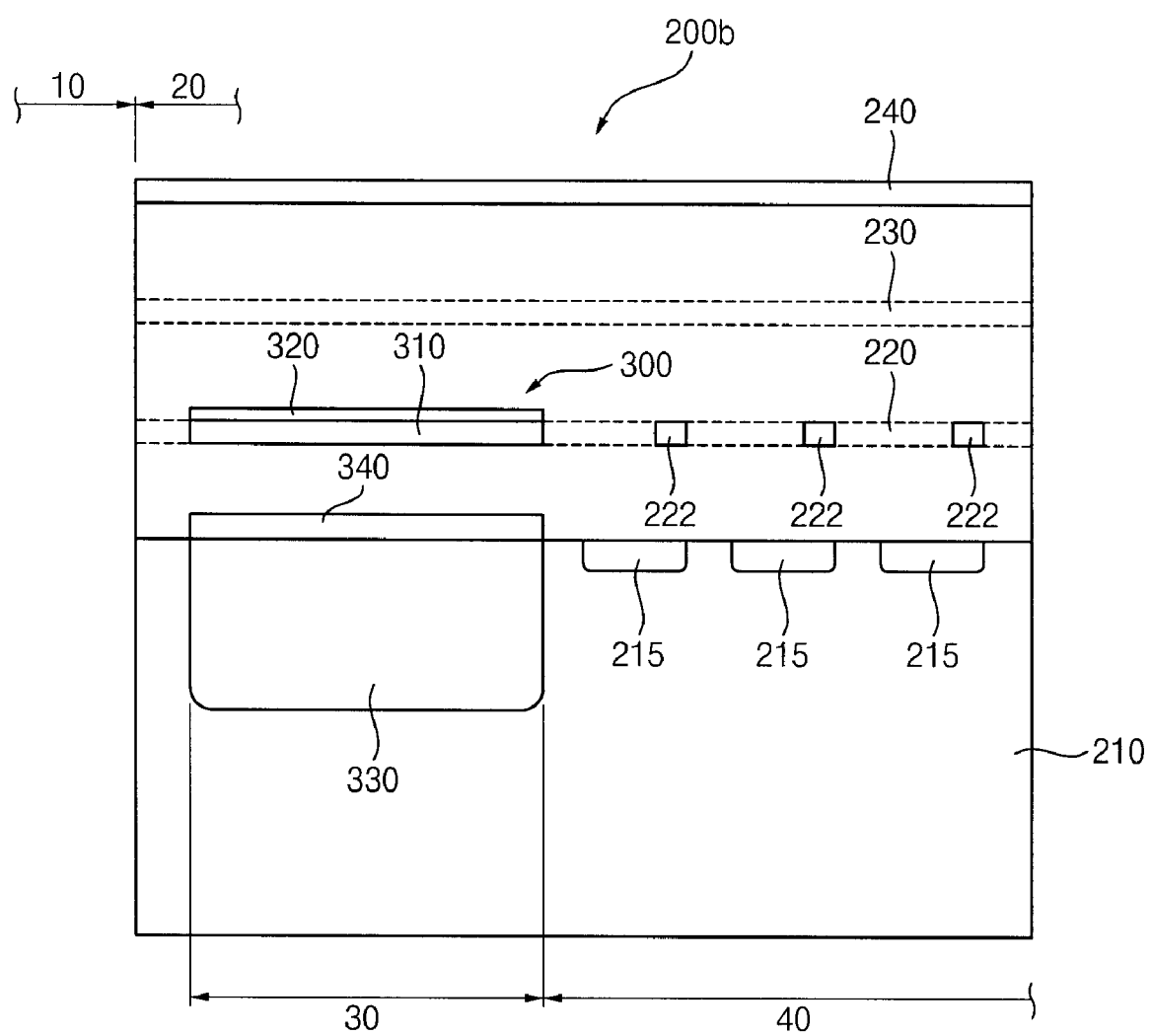

Referring to FIG. 6, an image sensor 200*b* may include an anti-reflection board 300 having a metal board 310 and an anti-reflection coating film 320, a drain 330 and a drain electrode 340. That is, the image sensor 200*b* further includes the drain 330 and the drain electrode 340 in comparison with the image sensor 200*a* of FIG. 5.

The substrate 210 of the image sensor 210*b* may include the drain 330 in the second region 30 beneath the anti-reflection board 300.

When a strong light is incident into the first pixels 211 of the active region 10, excessive electrons generated from the photoelectric conversion unit such as the photodiode PD in the first pixels 211 may overflow to the second pixels 215 of the optical black region 20, and then the reference signals Vref corresponding to the black level may be distorted. The drain 330 prevents the transferring of the excessive electrons from the active region 10 to the optical black region 20 by capturing the excessive electrons. A depth of the drain 330 may be greater than depths of the first pixels 211 in the active region 10 and the second pixels 215 in the first region 40 so as to sufficiently capture the excessive electrons.

The image sensor 200*b* may further include the drain electrode 340 on the drain 330, and the drain electrode 340 may be formed by including a poly-silicon layer and a silicide film on the poly-silicon layer.

The drain electrode 340 may be formed by the same process as forming gate electrodes (not shown) of the transistors M11, M12, M13 and M14 in the pixels 211 and 215. For example, the silicide film on the poly-silicon layer may be formed by a salicide process or a self-aligned silicide process. The poly-silicon layer is formed on an upper surface of the drain 330, a photosensitive film is formed on the poly-silicon layer and an exposed surface of the substrate 210, and the poly-silicon layer is exposed by eliminating the photosensitive film corresponding to a portion where the drain electrode 340 will be formed. A spacer film is formed at the both side walls of the exposed portion and impurities are eliminated by a cleaning process. Therefore, the silicide layer may be formed by the salicide process The image sensor 200*b* includes the drain electrode 340 as well as the anti-reflection board 300. The drain electrode 340 as well as the anti-reflection board 300 may absorb a light, for example, the light 151 as illustrated in FIG. 1, through the boundary between the active region 10 and the optical black region 20. Therefore, the image sensor 200*b* may further prevent the distortion of the black level than the image sensor 200*a*.

The substrate 210 of the image sensor 200*b* may be a p-type substrate and the drain 330 may be formed by doping n-type impurities. The drain 330 may be electrically connected to the metal board 310 in the anti-reflection board 300, and a positive voltage may be applied to the metal board 310. For example, the drain 330 may be electrically connected to the metal board 310 through a via-contact. When a positive voltage is applied to the drain 330, the drain 330 may prevent a transferring of a dark current from the active region 10 to the optical black region 20 by drawing the excessive electrons.

As described above, the light leakage prevention structure and the dark current prevention structure may be combined to each other according to the present general inventive concept, and thus the black level may be stabilized without additional processes.

Figure 7:
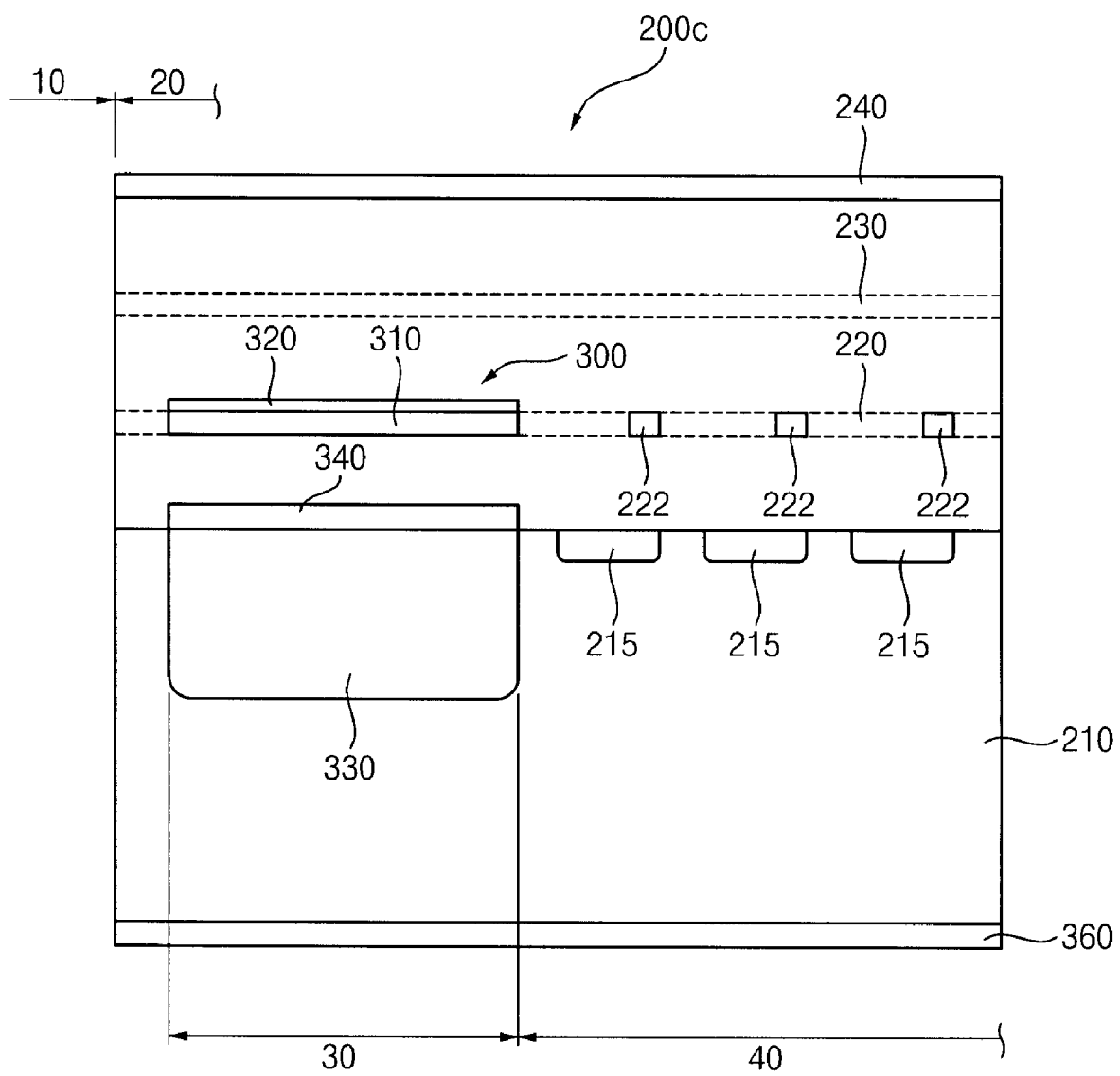

Referring to FIG. 7, an image sensor 200*c* further includes an anti-reflection coating film 360 under a lower surface of the substrate 210.

The anti-reflection coating film 360 formed under the lower surface of the substrate 210 may include a tantalum (Ta) or a nitrogen-containing tantalum (TaxNy). As illustrated above with reference to FIG. 1, a light having relatively long wavelength may reach the lower surface of the substrate 210, and the totally reflected light at the lower surface of the substrate 210 may distort the black level by causing the photoelectric effect of the second pixels 215. The anti-reflection coating film 360 formed under the lower surface of the substrate 210 absorbs such leakage light, and thus the image sensor 200*c* may further stabilize the black level than the image sensor 200*b* of FIG. 6.

By forming the anti-reflection coating film 360 on the substrate 210 in the second region 30, which is adjacent to the active region 10, a light, for example, the light 152 as illustrated in FIG. 1, may be prevented from reaching the second pixels 115.

At least one of the anti-reflection board 300, one of the drain 330 and the drain electrode 340, and the anti-reflection coating film 360 may be formed in an area corresponding to the second region 30.

Figure 8:
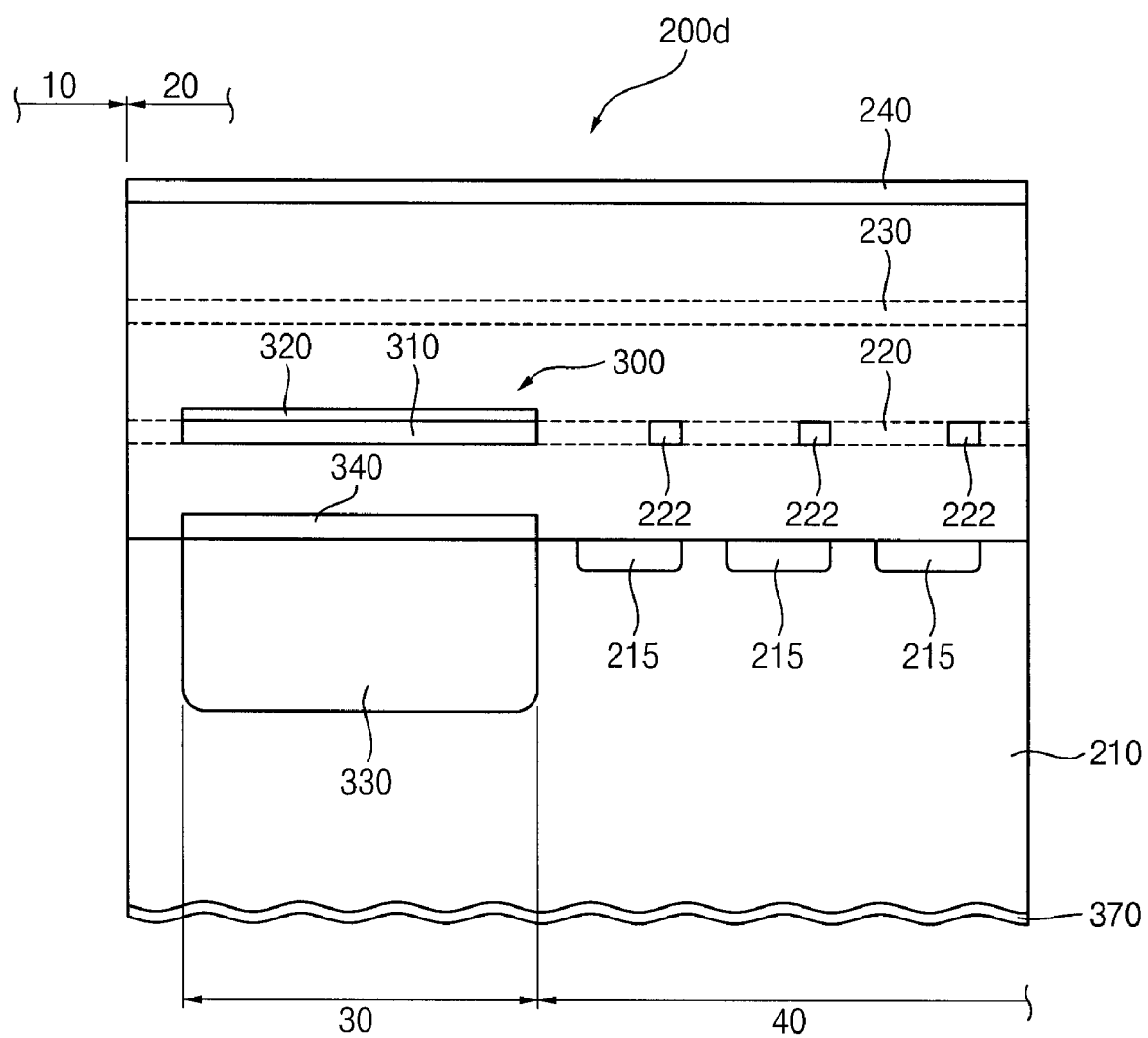

Referring to FIG. 8, an image sensor 200*d* has an increased roughness of a surface of the substrate 210. The surface of the substrate 210 may be a lower surface and may have a surface roughness greater than other surfaces of the substrate 210. When a light is incident to the surface of the substrate 210, the light may not directly reflected but may be diffused.

By increasing the surface roughness of the lower surface of the substrate 210 before forming the anti-reflection coating film 360, a diffused reflection may be caused at the lower surface of the substrate 210, so that the image sensor 200d may prevent the light leakage from being strengthened due to a constructive interference.

Figure 9:
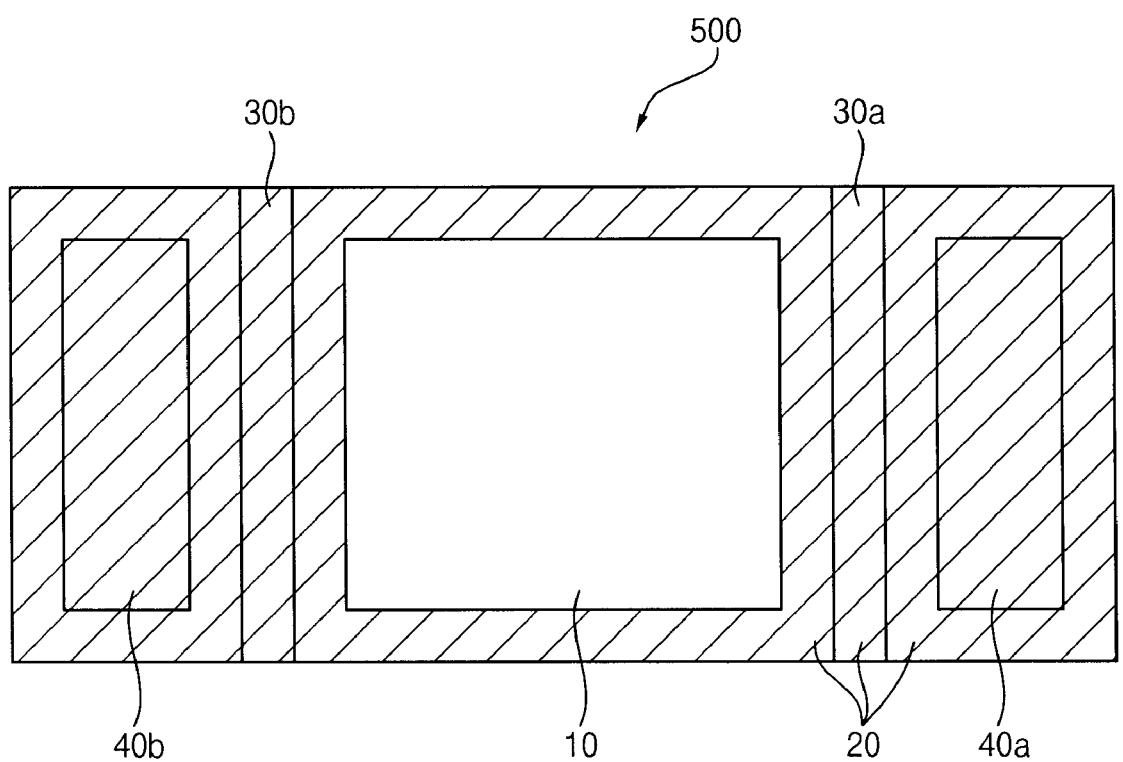
FIG. 9 is a diagram illustrating an image sensor according to an embodiment of the present genera inventive concept.

FIG. 9 is a diagram illustrating an image sensor according to an embodiment of the present general inventive concept.

Referring to FIG. 9, an image sensor 500 includes the active region 10 and the optical black region 20. The optical black region 20 of the image sensor 500 in FIG. 9 includes two first regions 40a and 40b spaced apart from each other and two second regions 30a and 30b spaced apart from each other.

The first pixels, that is, the active pixels, are formed in the active region 10 of the substrate to receive the light, and the second pixels, that is, the auto dark level compensation (ADLC) pixels, to compensate the black level (dark level), are formed at intervals in the first regions 40a and 40b spaced apart from the active region 10 in a row direction. For example, the ADLC pixels may be arranged alternately in row unit in the first regions 40a and 40b. For example, the ADLC pixels corresponding to odd-numbered rows may be arranged in the region 40a and the ADLC pixels corresponding to even-numbered rows may be arranged in the region 40b. One of the light leakage prevention structures described with reference to FIGS. 5 through 8 may be respectively formed in the two second regions 30a and 30b. A light shielding film is formed above the anti-reflection board, so that the optical black region 20 including the first regions 40a and 40b and the second regions 30a and 30b may be shielded by the light shielding film.

A light leakage prevention structure according to the present general inventive concept may be applied to an image sensor having an arbitrary layout as well as layouts illustrated in FIG. 2 and FIG. 9. For example, a row direction and a column direction described above may be reversed, and the light leakage prevention structure may be extended in the row direction.

As mentioned above, an apparatus and method according to the present general inventive concept may efficiently stabilize a black level of an image sensor. The image sensor according to the present general inventive concept may be used in a CCD type image sensor and a CMOS type image sensor to provide a stabilized black level, thereby improving a quality of a displayed image.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An image sensor comprising:
a substrate including first pixels for receiving a light and second pixels for black level compensation, the first pixels formed in an active region, the second pixels formed in a first region spaced apart from the active region in a row direction;
an anti-reflection board formed in a second region above the substrate, the second region disposed between the active region and the first region; and
a light shielding film formed above the anti-reflection board to cover an optical black region including the first and second regions,
wherein the substrate includes a drain formed in the substrate beneath the anti-reflection board in the second region,
wherein the image sensor further comprises:
a poly-silicon layer formed on an upper surface of the drain; and
a drain electrode including a silicide film formed on the poly-silicon.

2. The image sensor of claim 1, wherein the anti-reflection board includes:
a metal board extended in a column direction in the second region above the substrate; and
an anti-reflection coating film formed on an upper surface of the metal board.

3. The image sensor of claim 2, wherein the anti-reflection coating film includes a tantalum or a nitrogen-containing tantalum.

4. The image sensor of claim 2, wherein the metal board is formed on a first layer including wires extended in the column direction.

5. The image sensor of claim 1, wherein a row-directional length of the anti-reflection board is longer than a vertical interval between the substrate and the light shielding film.

6. The image sensor of claim 1, wherein a depth of the drain is greater than depths of the first and second pixels.

7. The image sensor of claim 1, wherein the substrate corresponds to a p-type substrate and the drain is formed by doping n-type impurities.

8. The image sensor of claim 7, wherein the drain is electrically connected to the metal board of the anti-reflection board, and a positive voltage is applied to the metal board.

9. The image sensor of claim 8, wherein the drain is electrically connected to the metal board through a via-contact.

10. The image sensor of claim 1, further comprising:
an anti-reflection coating film formed on a lower surface of the substrate.

11. The image sensor of claim 10, wherein the anti-reflection coating film formed on the lower surface of the substrate includes a tantalum or a nitrogen-containing tantalum.

12. The image sensor of claim 10, wherein a roughness of the lower surface of the substrate is increased before forming the anti-reflection coating film.

13. A method of stabilizing a black level in an image sensor, the method comprising:
forming first pixels in an active region of a substrate and forming second pixels in a first region spaced apart from the active region in row direction, the first pixels disposed to receive a light, the second pixels disposed to provide black level compensation;
forming an anti-reflection board in a second region above the substrate, the second region disposed between the active region and the first region;
forming a light shielding film above the anti-reflection board to cover an optical black region including the first and second regions;
forming a drain in the substrate beneath the anti-reflection board in the second region;
forming a poly-silicon layer on an upper surface of the drain; and
forming a drain electrode including a silicide on the poly-silicon.

14. The method of claim 13, wherein forming the anti-reflection board in the second region above the substrate includes:
forming a metal board extended in column direction in the second region above the substrate; and
forming an anti-reflection coating film on an upper surface of the metal board.

15. The method of claim 14, wherein forming the anti-reflection coating film on the upper surface of the metal board includes:

coating a tantalum or a nitrogen-containing tantalum on the upper surface of the metal board.

16. The method of claim 13, further comprising:

forming an anti-reflection coating film on a lower surface of the substrate.

17. The method of claim 16, further comprising:

increasing a roughness of the lower surface of the substrate before forming the anti-reflection coating film.

18. An image sensor comprising:

a substrate including first pixels to receive a light and second pixels to provide a reference level for black level compensation;

a light shield film formed above the substrate; and an anti-reflection board formed between the substrate and the light shield film and between the first pixels and the second pixels to prevent the light from being reflected toward the second pixels, wherein the substrate includes a drain formed in the substrate beneath the anti-reflection board in the second region, wherein the image sensor further comprises:

a poly-silicon layer formed on an upper surface of the drain; and a drain electrode including a silicide film formed on the poly-silicon.

19. The image sensor of claim 18, further comprising:

a wire layer disposed between the substrate and the light shield film to connect corresponding ones of the first pixels and the second pixels, wherein the anti-reflection board is formed on the wire layer.

20. The image sensor of claim 18, further comprising:

another anti-reflection board formed on the substrate.

21. The image sensor of claim 18, further comprising:

third pixels disposed opposite to the first pixels with respect to the first pixels to provide another reference level for black level compensation; and another anti-reflection board formed between the first pixels and the second pixels to prevent the light from being reflected toward the third pixels.

22. An image sensor comprising:

a substrate including first pixels to receive a light and second pixels to provide a reference level for black level compensation; and an anti-reflection board formed between the first pixels and the second pixels to prevent the light from being reflected toward the second pixels, wherein the substrate includes a drain formed in the substrate beneath the anti-reflection board in the second region, wherein the image sensor further comprises:

a poly-silicon layer formed on an upper surface of the drain; and a drain electrode including a silicide film formed on the poly-silicon.

* * * * *